(12) United States Patent
Hong et al.

(10) Patent No.: US 10,381,509 B2
(45) Date of Patent: Aug. 13, 2019

(54) LIGHT EMITTING DEVICE AND LIGHT UNIT HAVING SAME

(71) Applicant: LG INNOTEK CO., LTD., Seoul (KR)

(72) Inventors: Jung Yeop Hong, Seoul (KR); Myung Hee Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/553,517

(22) PCT Filed: Feb. 24, 2016

(86) PCT No.: PCT/KR2016/001789
§ 371 (c)(1),
(2) Date: Aug. 24, 2017

(87) PCT Pub. No.: WO2016/137220
PCT Pub. Date: Sep. 1, 2016

(65) Prior Publication Data
US 2018/0240936 A1 Aug. 23, 2018

(30) Foreign Application Priority Data
Feb. 25, 2015 (KR) .................. 10-2015-0026344

(51) Int. Cl.
*H01L 33/04* (2010.01)
*H01L 21/02* (2006.01)
(Continued)

(52) U.S. Cl.
CPC .......... *H01L 33/04* (2013.01); *H01L 21/0254* (2013.01); *H01L 21/02378* (2013.01);
(Continued)

(58) Field of Classification Search
CPC .......... H01L 33/04–33/06; H01L 33/12; H01L 21/0251–21/0254
See application file for complete search history.

(56) References Cited

U.S. PATENT DOCUMENTS 6,172,382 B1 1/2001 Nagahama et al.
2005/0230688 A1 10/2005 Lee
(Continued)

FOREIGN PATENT DOCUMENTS

CN 1753196 A 3/2006
CN 103208572 A 7/2013
(Continued)

OTHER PUBLICATIONS

International Search Report for PCT/KR2016/001789 (PCT/ISA/210) dated May 27, 2016.

*Primary Examiner* — Latanya N Crawford
(74) *Attorney, Agent, or Firm* — Bich, Stewart, Kolasch & Birch, LLP

(57) ABSTRACT

The present embodiments relate a light emitting device. According to the present embodiment, there is provided a light emitting device includes: a first conductive semiconductor layer; an active layer that is disposed on the first conductive semiconductor layer and has a plurality of barrier layers and a plurality of well layers; a plurality of superlattice layers that is disposed under the first conductive semiconductor layer; and a second conductive semiconductor layer which is disposed on the active layer, in which the plurality of superlattice layers include at least three superlattice layers, in which each of the at least three superlattice layers has a plurality of pairs of at least a first layer and a second layer, in which composition of aluminum in the first layer of the superlattice layer is gradually decreased, as the superlattice layer among the at least three superlattice layers is one which is positioned to be adjacent to the active layer, and in which each of the at least three superlattice layers has the same composition of aluminum in the second layer.

20 Claims, 6 Drawing Sheets

(51) Int. Cl.
*H01L 33/12* (2010.01)
*H01L 33/32* (2010.01)
*H01L 33/14* (2010.01)
*H01L 33/22* (2010.01)
*H01L 33/40* (2010.01)

(52) U.S. Cl.
CPC .. *H01L 21/02458* (2013.01); *H01L 21/02507* (2013.01); *H01L 21/02579* (2013.01); *H01L 33/12* (2013.01); *H01L 21/02576* (2013.01); *H01L 33/145* (2013.01); *H01L 33/22* (2013.01); *H01L 33/32* (2013.01); *H01L 33/405* (2013.01)

(56) References Cited

U.S. PATENT DOCUMENTS

| | | |
|---|---|---|
| 2007/0063207 A1 | 3/2007 | Tanizawa et al. |
| 2009/0090901 A1 | 4/2009 | Kim |
| 2013/0181188 A1 | 7/2013 | Ooshika |
| 2014/0209862 A1 | 7/2014 | Ikuta et al. |
| 2015/0060908 A1* | 3/2015 | Jain ................. H01L 31/035272 257/94 |
| 2015/0083994 A1* | 3/2015 | Jain ..................... H01L 33/0025 257/13 |
| 2015/0192278 A1* | 7/2015 | Meng ..................... H01L 33/58 362/612 |
| 2015/0318448 A1 | 11/2015 | Nan et al. |
| 2016/0172534 A1 | 6/2016 | Iwata et al. |

FOREIGN PATENT DOCUMENTS

| | | |
|---|---|---|
| CN | 103236477 A | 8/2013 |
| CN | 103782375 A | 5/2014 |
| JP | 2007-67077 A | 3/2007 |
| JP | 2013-21124 A | 1/2013 |
| JP | 2013-165261 A | 8/2013 |
| JP | 2015-35536 A | 2/2015 |
| KR | 10-2004-0016723 A | 2/2004 |
| KR | 10-2004-0029166 A | 4/2004 |
| KR | 10-2006-0107586 A | 10/2006 |
| KR | 10-2009-0035934 A | 4/2009 |
| KR | 10-2014-0020028 A | 2/2014 |
| KR | 10-2014-0098518 A | 8/2014 |
| WO | WO 2015/020233 A1 | 2/2015 |

* cited by examiner

[FIG. 1]
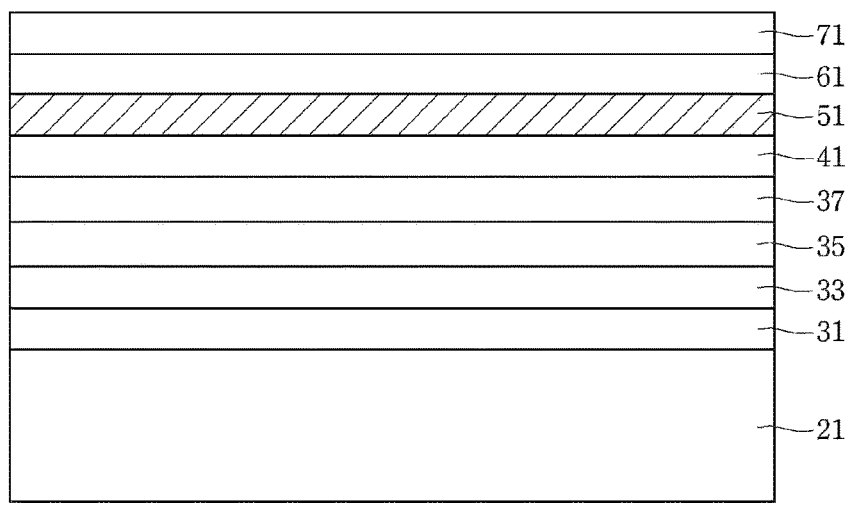
[FIG. 2]
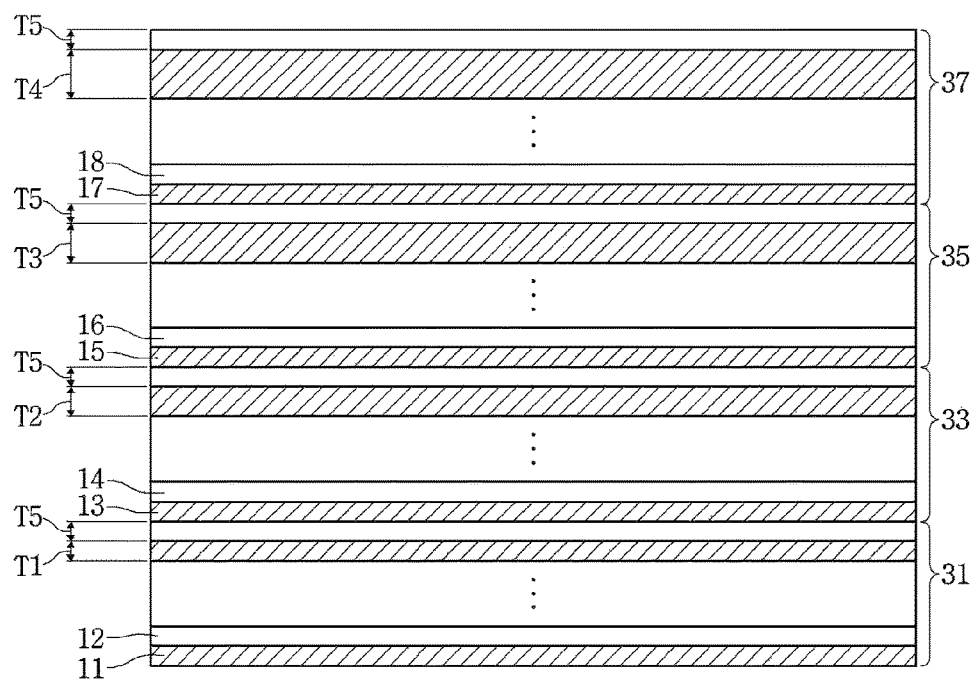

【FIG. 3】
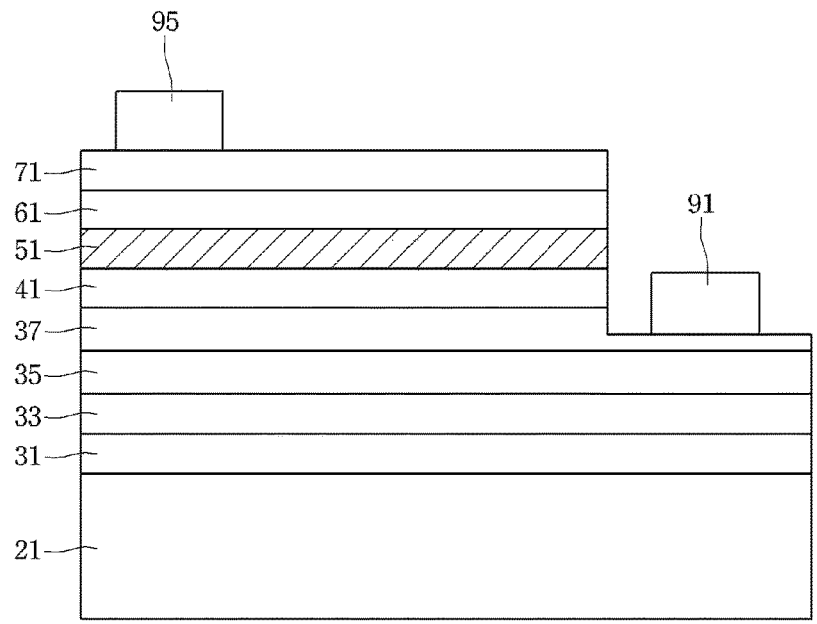
【FIG. 4】
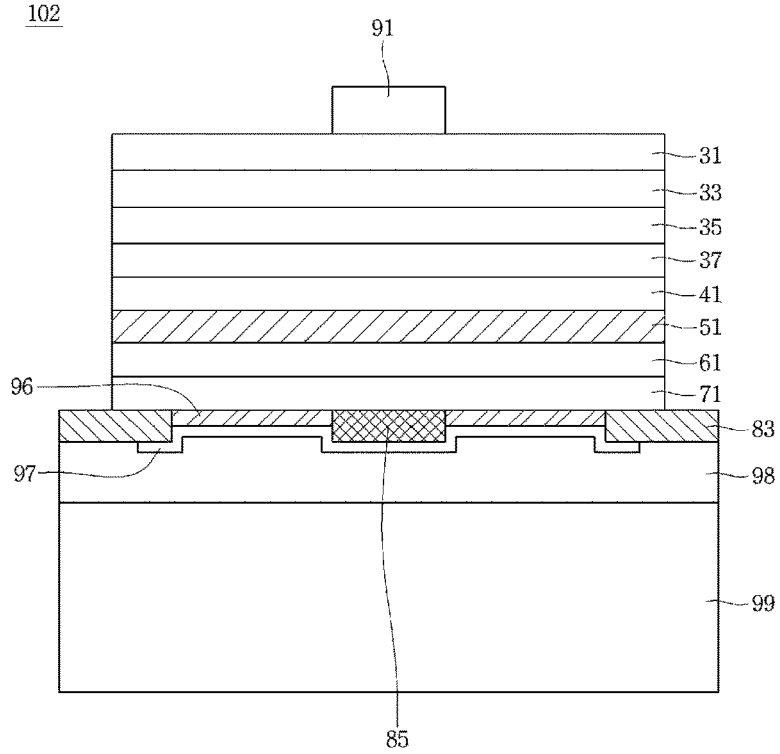

[FIG. 5]
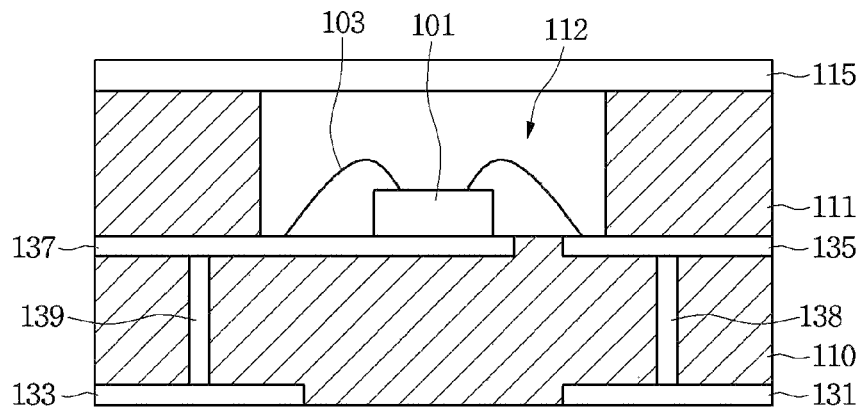
[FIG. 6]
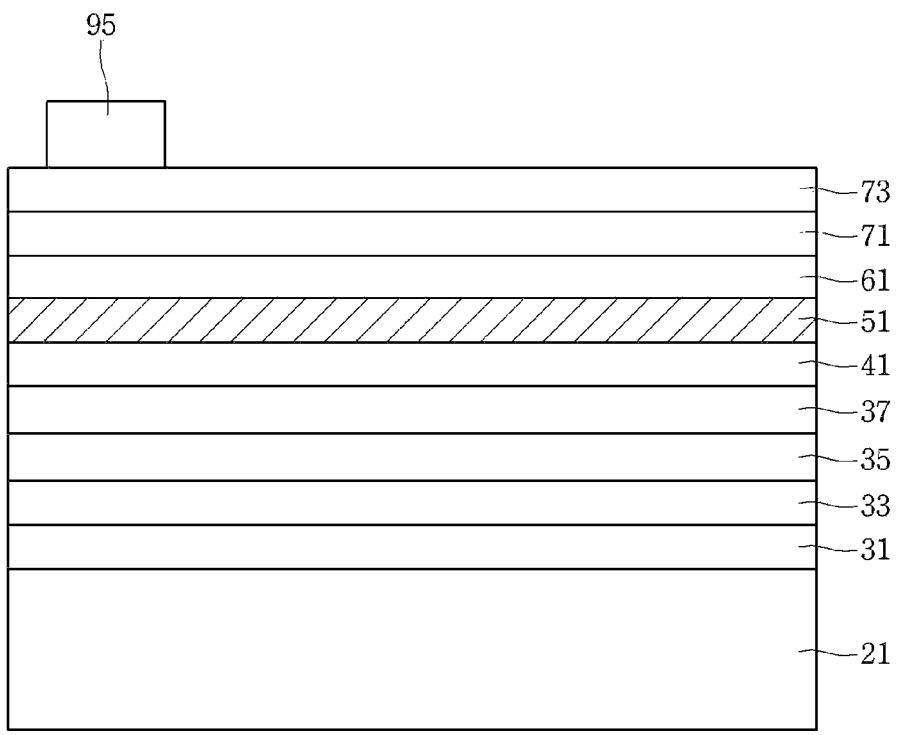

[FIG. 7]
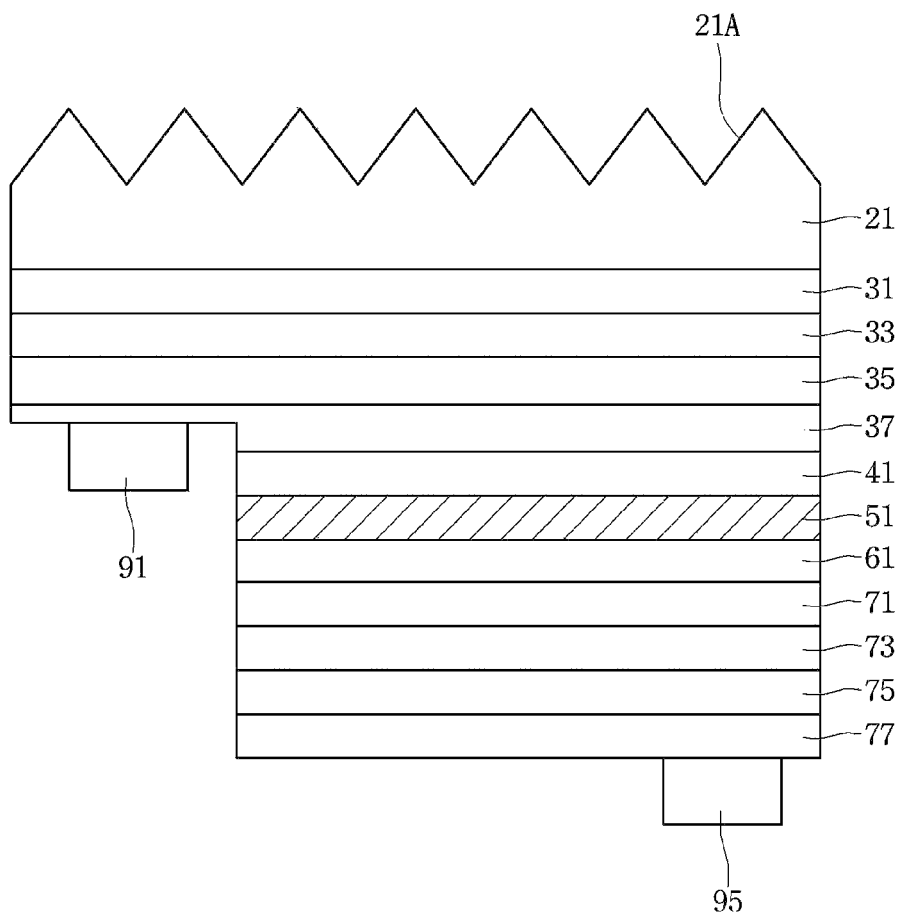
[FIG. 8]
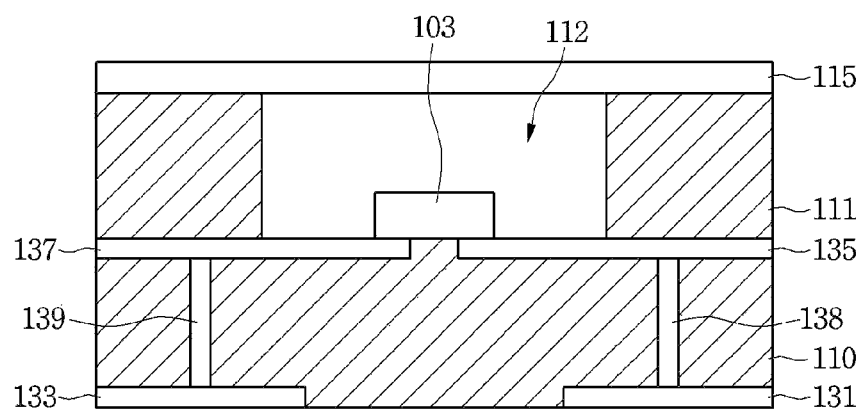

[FIG. 9]
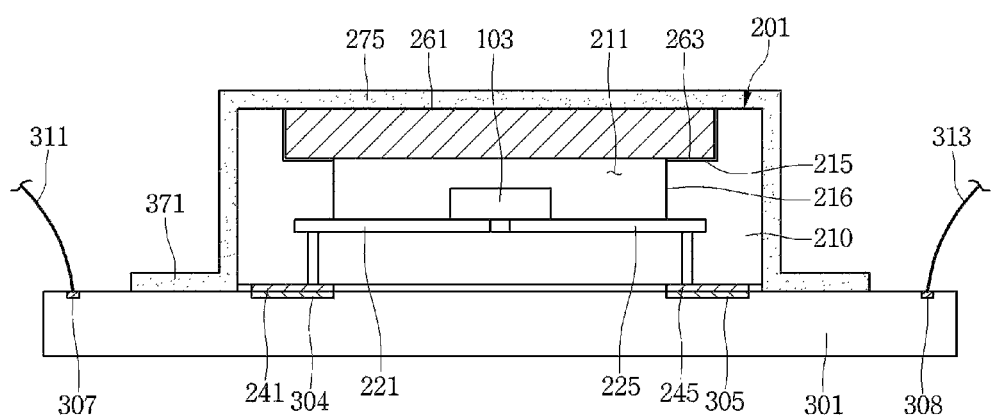
[FIG. 10]
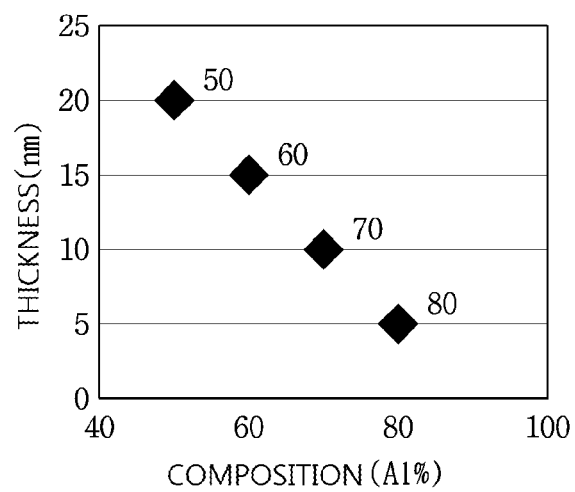

[FIG. 11]
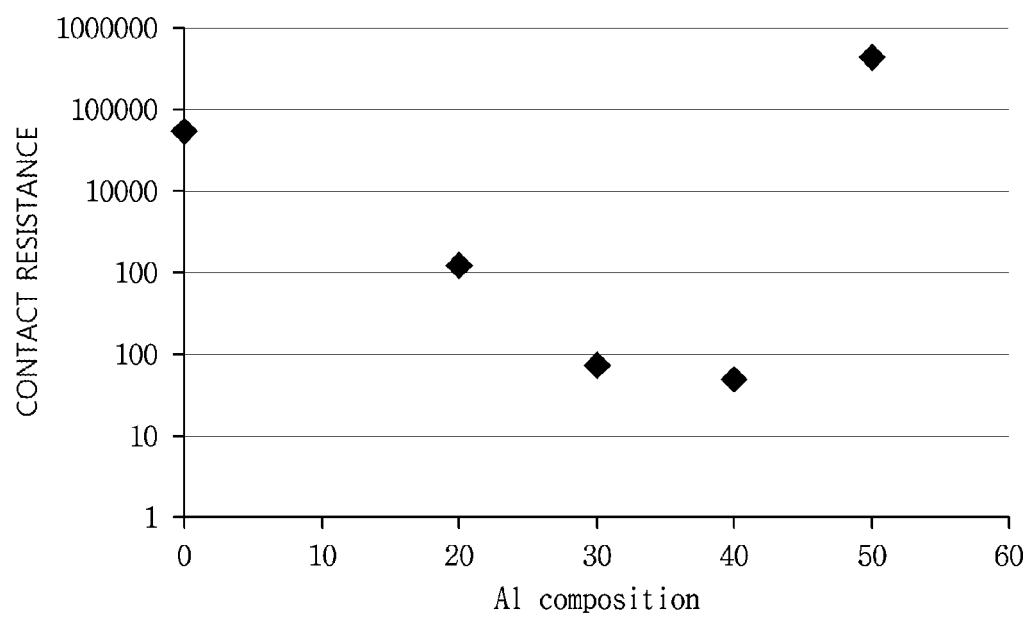

LIGHT EMITTING DEVICE AND LIGHT UNIT HAVING SAME

CROSS REFERENCE TO RELATED APPLICATIONS

This application is the National Phase of PCT International Application No. PCT/KR2016/001789, filed on Feb. 24, 2016, which claims priority under 35 U.S.C. 119(a) to Patent Application No. 10-2015-0026344, filed in the Republic of Korea on Feb. 25, 2015, all of which are hereby expressly incorporated by reference into the present application.

TECHNICAL FIELD

The present embodiments relate to a light emitting device.

The present embodiments relate to an ultraviolet light emitting device.

The present embodiments relate to a light unit having an ultraviolet light emitting device.

BACKGROUND ART

In general, a nitride semiconductor material including a group V source such as nitrogen (N) and a group III source such as gallium (Ga), aluminum (Al), or indium (In) has excellent thermal stability and a direct transition type energy band structure and thus is widely used as a material for a nitride-based semiconductor device such as a nitride-based semiconductor light emitting device in an ultraviolet light region and a solar cell.

The nitride-based material has a wide energy band gap of 0.7 eV to 6.2 eV, and thus is widely used as a material for a solar cell device due to the characteristics matching with the solar spectrum region. In particular, ultraviolet light emitting devices are used in various industrial fields such as a curing apparatus, a medical analyzer, a therapeutic apparatus, and a sterilizing, water purification, and purification system and is attracting attention as a usable material for general illumination as a semiconductor lighting source in the future.

DISCLOSURE

Technical Problem

The present embodiments provide a light emitting device having a plurality of superlattice layers under a first conductive semiconductor layer and a light unit having the same.

The present embodiments provide a light emitting device that can decrease defects by disposing a plurality of superlattice layers between the first conductive semiconductor layer and a substrate and a light unit having the same.

The present embodiments provide a light emitting device in which composition of aluminum in at least one layer of each pair of the plurality of superlattice layers is gradually decreased, as the superlattice layer is positioned to be adjacent to an active layer and a light unit having the same.

The present embodiments provide a light emitting device in which the thickness of at least one layer of each pair of the plurality of superlattice layers is gradually increased, as the superlattice layer is positioned to be closer to the active layer and a light unit having the same.

The present embodiments provide a light emitting device that emits light having an ultraviolet wavelength, for example, an ultraviolet-C (UV-C) wavelength, and a light unit having the same.

Technical Solution

According to the present embodiment, there is provided a light emitting device includes: a first conductive semiconductor layer; an active layer that is disposed on the first conductive semiconductor layer and has a plurality of barrier layers and a plurality of well layers; a plurality of superlattice layers that is disposed under the first conductive semiconductor layer; and a second conductive semiconductor layer which is disposed on the active layer, in which the plurality of superlattice layers include at least three superlattice layers, in which each of the at least three superlattice layers has a plurality of pairs of at least a first layer and a second layer, in which composition of aluminum in the first layer of the superlattice layer is gradually decreased, as the superlattice layer among the at least three superlattice layers is one which is positioned to be adjacent to the active layer, and in which each of the at least three superlattice layers has the same composition of aluminum in the second layer.

According to the present embodiment, there is provided a light emitting device includes: a first conductive semiconductor layer; an active layer that is disposed on the first conductive semiconductor layer and has a plurality of barrier layers and a plurality of well layers; a plurality of superlattice layers that is disposed under the first conductive semiconductor layer; and a second conductive semiconductor layer which is disposed on the active layer, in which the plurality of superlattice layers includes at least three superlattice layers, in which each of the at least three superlattice layers has a plurality of pairs of at least a first layer and a second layer, in which difference in composition of the aluminum between the first layer and the second layer of the superlattice layer is gradually increased, as the superlattice layer among the at least three superlattice layers is one which is positioned to be adjacent to the active layer, and in which the thickness of the first layer of the superlattice layer is gradually increased, as the superlattice layer among the at least three superlattice layers is one which is positioned to be adjacent to the active layer.

Advantageous Effects

According to the light emitting device of the embodiments, defects which are transferred to the active layer can be removed.

According to the light emitting device of the embodiments, internal quantum efficiency can be improved.

The embodiments can improve reliability of the ultraviolet light emitting device for sterilization.

The embodiments can provide a light emitting device package having an ultraviolet light emitting device and a light unit such as an ultraviolet lamp.

DESCRIPTION OF DRAWINGS

FIG. 1 is a view illustrating a light emitting device according to a first embodiment.

FIG. 2 is a view explaining a plurality of superlattice layers illustrated in FIG. 1.

FIG. 3 is a view illustrating an example in which electrodes are disposed in the light emitting device of FIG. 1.

FIG. 4 is a view illustrating another example in which electrodes are disposed in the light emitting device of FIG. 1.

FIG. 5 is a cross-sectional view illustrating a light emitting device package having the light emitting device of FIG. 3.

FIG. 6 is a view illustrating a light emitting device according to a second embodiment.

FIG. 7 is a view illustrating an example in which electrodes are disposed in the light emitting device of FIG. 6.

FIG. 8 is a cross-sectional view illustrating a light emitting device package having the light emitting device of FIG. 6.

FIG. 9 is a view illustrating a light unit having a light emitting device according to an embodiment.

FIG. 10 is a graph illustrating a relationship between the composition and thickness of aluminum in a plurality of superlattice layers according to the embodiment.

FIG. 11 is a graph illustrating a relationship of a contact resistance according to the composition of aluminum of a third conductive semiconductor layer in the light emitting device according to the second embodiment.

BEST MODE

In the description of embodiments, in a case where it is described that respective layers (films), regions, patterns or structures are formed "on/over" or "under" substrates, respective layers (films), regions, pads or patterns, a state where the layer or the like is formed "on/over" and the "under" the substrates or the like includes all a state where the layer or the like is formed "directly" or "by interposing the other layer therebetween (indirectly)" on/over and under the substrate or the like. In addition, the criteria for on/over or under of respective layers will be described with reference to the drawings.

<Light Emitting Device>

FIG. 1 is a cross-sectional view illustrating a light emitting device according to a first embodiment.

With reference to FIG. 1, the light emitting device according to the embodiment includes a substrate 21, a plurality of superlattice layers 31, 33, 35, and 37 that are disposed on the substrate 21, a first conductive semiconductor layer 41 that is disposed on the plurality of superlattice layers 31, 33, 35, and 37, an active layer 51 that is disposed on the first conductive semiconductor layer 41, a electron blocking layer 61 that is disposed on the active layer 51, and a second conductive semiconductor layer 71 that is disposed on the electron blocking layer 61.

The light emitting device emits light having ultraviolet wavelength. The light emitting device can emit light having a wavelength of 300 nm or less, for example, a wavelength in a range of 200 nm to 290 nm. The light emitting device may be a device that emits light having a UV-C wavelength.

The substrate 21 may be a translucent substrate, a conductive substrate or an insulating substrate, for example. For example, the substrate 21 may include at least one of sapphire ($Al_2O_3$), SiC, Si, GaAs, GaN, ZnO, GaP, InP, Ge, and $Ga_2O_3$. A plurality of protrusion portion (not illustrated) may be formed on an upper surface and/or a lower surface of the substrate 21, a side end surface of each of the plurality of protrusion portions may include at least one of a hemispherical shape, a polygonal shape, and an oval shape, and the protrusion portions may be disposed in a strip form or a matrix form. The protrusion portions can improve the light extraction efficiency.

A plurality of compound semiconductor layers may be grown on the substrate 21 and growth equipment of the plurality of compound semiconductor layers may be formed by an electron beam evaporator, physical vapor deposition (PVD), chemical vapor deposition (CVD), plasma laser deposition (PLD), a dual-type thermal evaporator, sputtering, metal organic chemical vapor deposition (MOCVD), or the like. However, the present embodiment is not limited thereto.

The plurality of superlattice layers 31, 33, 35, and 37 may be disposed between the substrate 21 and the first conductive semiconductor layer 41. The active layer 51 may be disposed on the first conductive semiconductor layer 41.

The plurality of superlattice layers 31, 33, 35, and 37 may include at least three superlattice layers, for example, at least four superlattice layers. Each of the plurality of superlattice layers 31, 33, 35, and 37 may include a plurality of pairs and one pair of the plurality of pairs includes at least two layers. In the plurality of superlattice layers 31, 33, 35, and 37, any one layer of each pair may be implemented by a group II-VI or a group III-V compound semiconductor and the other layer thereof may be implemented by a group II-VI or a group III-V compound semiconductor, as an example.

With reference to FIG. 2, each of the plurality of superlattice layers 31, 33, 35, and 37 may include a pair of first layers 11, 13, 15, and 17 and second layers 12, 14, 16, and 18 and the first layer 11, 13, 15, and 17 and the second layer 12, 14, 16, and 18 may include materials which are different from each other. In each of the superlattice layers 31, 33, 35, and 37, the first layers 11, 13, 15, and 17 and the second layers 12, 14, 16, and 18 may be disposed alternately.

Composition of aluminum of the first layers 11, 13, 15, and 17 of the superlattice layer can be gradually decreased, as the superlattice layer among the superlattice layers 31, 33, 35, and 37 is one which is positioned to be adjacent to the active layer 51. Difference in composition of aluminum of the first layer 11, 13, 15, and 17 and the second layer 12, 14, 16, and 18 of the superlattice layer can be gradually increased, as the superlattice layer among the superlattice layers 31, 33, 35, and 37 is one which is positioned to be adjacent to the active layer 51. Each of the superlattice layers 31, 33, 35, and 37 may have the same composition of aluminum in the second layers 12, 14, 16, and 18.

The thicknesses T1, T2, T3, and T4 of the first layer 11, 13, 15, and 17 of the superlattice layer can be gradually increased, as the superlattice layer among the superlattice layers 31, 33, 35, and 37 is one which is positioned to be adjacent to the active layer 51. The thicknesses of the plurality of superlattice layers 31, 33, 35, and 37 may be gradually increased, as the superlattice layer is positioned to be adjacent to the active layer 51.

The pair of the first layer 11, 13, 15, and 17/the second layer 12, 14, 16, and 18 of each of the superlattice layers 31, 33, 35, and 37 may include a pair of AlGaN/AlN. Composition of aluminum of AlGaN of the first layers 11, 13, 15, and 17 is gradually decreased, as the first layer is positioned to be adjacent to the active layer 51.

The difference in the composition of aluminum between the first layers 11, 13, 15, and 17 provided in the adjacent two superlattice layers among the plurality of superlattice layers 31, 33, 35, and 37 may be 10% or more. The difference in the composition of aluminum between the first layers 11, 13, 15, and 17 provided in the two superlattice layers positioned on the opposite sides to each other among the plurality of superlattice layers 31, 33, 35, and 37 may be 30% or more.

The plurality of superlattice layers 31, 33, 35, and 37 include, for example, first to fourth superlattice layers 31, 33, 35, and 37. The first superlattice layer 31 may be disposed between the substrate 21 and the second superlattice layer 33, the second superlattice layer 33 may be disposed between the first superlattice layer 31 and the third superlattice layer 35, the third superlattice layer 35 is disposed between the second superlattice layer 33 and the fourth superlattice layer 37, and the fourth superlattice layer 37 may be disposed between the third superlattice layer 35 and the first conductive semiconductor layer 41.

The first superlattice layer 31 includes a pair of a first layer 11 and a second layer 12 and the pair may include 8 to 20 pairs such as 10 to 15 pairs. The first layer 11 is a semiconductor material having a composition formula of $Al_aGa_{1-a}N$ (0<a<1) and the second layer 12 may be AlN. The difference in composition of aluminum between the first layer 11 and the second layer 12 in the first superlattice layer 31 may have 20% or more.

The thickness T1 of the first layer 11 in the first superlattice layer 31 is less than the thickness T1, T2, T3, and T4 of the first layer 13, 15, and 17 of the second to fourth superlattice layers 33, 35, and 37 and may include a range of 5 nm to 20 nm, for example. The thickness T5 of the second layer 12 in the first superlattice layer 31 may include a range from 5 nm to 20 nm. By providing the thicknesses T1 and T5 of the first layer 11 and the second layer 12 of the first superlattice layer 31 in the range described above, defects due to difference in lattice constant between the substrate 21 and the first superlattice layer can be decreased and stress which is transmitted to the second superlattice layer 33 can be decreased. The thicknesses T1 and T5 of the first layer 11 and the second layer 12 of the first superlattice layer 31 may be the same. However, the present embodiment is not limited thereto.

The second superlattice layer 33 includes a pair of a first layer 13 and a second layer 14 and the pair may include 8 to 20 pairs, such as 10 to 15 pairs. In the second superlattice layer 33, the first layer 13 is a semiconductor material having a composition formula of $Al_bGa_{1-b}N$ (0<b<1) and the second layer 14 may be AlN. The difference in composition of aluminum between the first layer 13 and the second layer 14 in the second superlattice layer 33 may be 30% or more. Since the second layer 14 has composition of aluminum which is higher than that of the first layer 13 by 30% or more, a semiconductor having a small lattice constant can be provided.

The thickness T2 of the first layer 13 in the second superlattice layer 33 may be less than the thicknesses T3 and T4 of the first layers 15 and 17 of the third and fourth superlattice layers 35 and 37 and includes a range of 12 nm to 22 nm, for example. The thickness T5 of the second layer 14 in the second superlattice layer 33 may include a range from 5 nm to 20 nm. By the thicknesses T2 and T5 of the first layer 13 and the second layer 14 of the second superlattice layer 33 being provided in the range described above, defects which are transferred through the first superlattice layer 31 can be decreased and stress which is transmitted to the third superlattice layer 35 can be decreased. The thickness T2 of the first layer 13 of the second superlattice layer 33 may be more than the thickness T5 of the second layer 14. Since the second layer 13 of the second superlattice layer 33 having a small lattice constant and a thin thickness is provided, the second layer can serve as a layer for controlling defects in the second superlattice layer 33.

The third superlattice layer 35 includes a pair of a first layer 15 and a second layer 16 and the pair may include 8 to 20 pairs, such as 10 to 15 pairs. In the third superlattice layer 35, the first layer 15 is a semiconductor material having a composition formula of $Al_cGa_{1-c}N$ (0<c<1) and the second layer 16 may be AlN. The difference in composition of aluminum between the first layer 15 and the second layer 16 in the third superlattice layer 35 may be 40% or more. By composition of aluminum of the first layer 15 of the third superlattice layer 35 being less than that of the first layer 13 of the second superlattice layer 33, crystal quality of the semiconductor layer can be improved.

The thickness T3 of the first layer 15 in the third superlattice layer 35 may be less than the thickness T4 of the first layer 17 of the fourth superlattice layer 37, and includes a range from 15 nm to 25 nm, for example. The thickness T5 of the second layer 16 in the third superlattice layer 35 includes a range of 5 nm to 20 nm. By providing the thicknesses T3 and T5 of the first layer 15 and the second layer 16 of the third superlattice layer 35 in the range described above, defects which are transferred through the second superlattice layer 33 can be decreased and stress which is transmitted to the fourth superlattice layer 37 can be decreased. The thickness T3 of the first layer 15 of the third superlattice layer 35 may be more than the thickness T5 of the second layer 16 thereof. Since the second layer 16 of the third superlattice layer 35 having a small lattice constant and a thin thickness is provided, the second layer can serve as a layer for controlling defects in the third superlattice layer 35.

The fourth superlattice layer 37 includes a pair of a first layer 17 and a second layer 18 and the pair may include 8 to 20 pairs, such as 10 to 15 pairs. In the fourth superlattice layer 37, the first layer 17 is a semiconductor material having a composition formula of $Al_dGa_{1-d}N$ (0<d<1) and the second layer 18 may be AlN. The difference in composition of aluminum between the first layer 17 and the second layer 18 in the fourth superlattice layer 37 may be 45% or more and may be 50% or more, for example. By the composition of aluminum of the first layer 17 of the fourth superlattice layer 37 being less than that of the first layer 15 of the third superlattice layer 35, crystal quality of the semiconductor layer can be improved.

The thickness T4 of the first layer 17 in the fourth superlattice layer 37 may be more than the thicknesses T1, T2, and T3 of the first layers 11, 13, and 15 of the first to fourth superlattice layers 31, 33, and 35 and may include a range of 17 nm to 30 nm, for example. The thickness T5 of the second layer 18 in the fourth superlattice layer 37 include a range from 5 nm to 20 nm. By providing the thicknesses T4 and T5 of the first layer 17 and the second layer 18 of the fourth superlattice layer 37 in the range described above, defects which are transferred through the third superlattice layer 35 can be decreased and stress which is transmitted to the first conductive semiconductor layer 41 can be decreased. The thickness T4 of the first layer 17 of the fourth superlattice layer 37 may be more than the thickness T5 of the second layer 18. Since the second layer 18 of the fourth superlattice layer 37 having a small lattice constant and a thin thickness is provided, the second layer can serve as a layer for controlling defects in the fourth superlattice layer 37.

The Al composition $Al_a$, $Al_b$, $Al_c$, and $Al_d$ of AlGaN which is the first layer 11, 13, 15, and 17 in the first to fourth superlattice layers 31, 33, 35, and 37 may be a>b>c>d, the difference between aluminum compositions a and b may be 10% or more, the difference between aluminum compositions b and c of may be 10% or more, and the difference between aluminum compositions c and d may be 10% or more. The difference between aluminum compositions a and d may be 30% or more. The difference between the aluminum compositions of AlN which is the second layer 12, 14, 16, and 18 and the aluminum composition a may be 20%±2% or more, the difference between the aluminum compositions of AlN and the aluminum composition b may be 30%±3% or more, the difference between the aluminum compositions of AlN and the aluminum composition c may be 40%±4% or more, and the difference between the aluminum composition of MN and the aluminum composition d may be 50%±5% or more. By aluminum composition of the first layers 11, 13, 15, and 17 of the first to fourth superlattice layers 31, 33, 35, and 37 being gradually decreased, defects in the layer adjacent to the active layer can be decreased.

The composition of aluminum of the first layers 11, 13, 15, and 17 of the superlattice layer may be gradually decreased and may be decreased by a difference of up to 50% or more, and the thicknesses T1, T2, T3, and T4 of the first layers 11, 13, 15, and 17 thereof may be gradually increased, as the superlattice layer among the superlattice layers 31, 33, 35, and 37 is one which is positioned to be adjacent to the active layer 51. Since the first to fourth super lattice layers 31, 33, 35, and 37 are disposed under the active layer 51, defects which are transmitted from the substrate 21 can be removed and stress which is transmitted to the upper portion can be decreased.

In the first to fourth superlattice layers 31, 33, 35, 37 according to the embodiment, By a pair of the first layer 11, 13, 15, and 17 and the second layer 12, 14, 16, and 18 being disposed as the AlN/AlGaN pair, transmittance with respect to the ultraviolet wavelength can be improved. An a-axis lattice constant values are listed in the order of AlN>AlGaN>GaN, when AlN is grown on AlGaN having a small a-axis lattice constant value, compressive stress is applied and when AlGaN is grown on AlN again, tensile stress is applied. By such a growth of AlGaN/AlN being periodically repeated, the compressive stress and the tensile stress, which are opposite stresses to each other, are canceled. In addition, since AlGaN and AlN have a wurtzite crystal structure which is crystallographically identical to each other, a stable superlattice structure can be provided.

In the embodiment, by a plurality of superlattice layers 31, 33, 35, and 37 being disposed on the substrate 21, dislocations can be effectively blocked compared with the case where a single n-type semiconductor layer is disposed on the substrate 21 and decrease in quality due to difference in lattice constant can be prevented. In addition, by the composition of aluminum in the first layers 11, 13, 15, and 17 of the plurality of superlattice layers 31, 33, 35, and 37 being gradually decreased as the superlattice layer is positioned to be adjacent to the active layer 51, decrease in film quality due to the difference in an a-axis lattice constant can be prevented. The composition of aluminum of the first layer may be smaller, as the first layer among the first layer 11, 13, 15, and 17 of a plurality of the superlattice layers 31, 33, 35, and 37 is one which is positioned to be adjacent to the first conductive semiconductor layer 41. The composition of aluminum of the first layer may be larger, as the first layer among the first layers 11, 13, 15, and 17 of the superlattice layers 31, 33, 35, and 37 is one which is positioned to be distant from the first conductive semiconductor layer 41. By the thickness (T1<T2<T3<T4) of the first layer 11, 13, 15 and 17 of the plurality of superlattice layers 31, 33, 35 and 37 being provided to be thick, as the superlattice layer is positioned to be adjacent to the active layer 51, the difference in a c-axis lattice constant values thereof is minimized, polarization phenomenon thereof is improved, and dislocations which are transmitted from the lower layer can be prevented. As illustrated in FIG. 10, the thickness of a first layer is gradually increased, as the first layer among the first layers 11, 13, 15, and 17 of the plurality of superlattice layers 31, 33, 35, and 37 is one which is positioned to be adjacent to the active layer 51 and composition of aluminum thereof is decreased.

The plurality of superlattice layers 31, 33, 35, and 37 may include a first conductive type dopant, for example, n-type dopants such as Si, Ge, Sn, Se, and Te. The plurality of superlattice layers 31, 33, 35 and 37 may be n-type semiconductor layers and, for example, the first layers 11, 13, 15, and 17 and the second layer 12, 14, 16, and 18 of each of the superlattice layers 31, 33, 35, and 37 may be an n-type semiconductor layer.

The first conductive semiconductor layer 41 may be disposed on the plurality of superlattice layers 31, 33, 35, and 37. The composition of aluminum of the first conductive semiconductor layer 41 may have the same composition as the composition of aluminum of the first layer 17 of the fourth superlattice layer 37 which is positioned to be adjacent to the first conductive semiconductor layer 41 and there may be difference of 45% or more between the composition of aluminum of the first conductive semiconductor layer 41 and the composition of aluminum of the second layer 18 of the fourth superlattice layer 37. The first conductive semiconductor layer 41 may be disposed as a semiconductor having a composition of $Al_eGa_{1-e}N$ (0<e<1), and $Al_e$ may be the same as $Al_d$ (d=e) or more than $Al_c$ (c<e) and may be higher than the composition of aluminum of a well layer in the active layer 51.

The thickness of the first conductive semiconductor layer 41 may be more than the thickness T4 of the first layer 17 of the fourth superlattice layer 37 which is positioned to be adjacent to the first conductive semiconductor layer 41 by 40 times or more. For example, the first conductive semiconductor layer 41 may have a composition of aluminum of a range of 50%±5% and a thickness of a range of 1000 nm±100 nm. By the aluminum of the first conductive semiconductor layer 41 having difference in composition of aluminum of about 50% compared to that of AlN and being provided to be thick, polarization phenomenon and defects which are transmitted to the active layer 51 can be decreased.

The first conductive semiconductor layer 41 may include at least one of other semiconductors including aluminum, such as InAlGaN, AlInN, AlGaAs, and AlGaInP material. The first conductive semiconductor layer 41 may be an n-type semiconductor layer doped with a first conductive dopant, for example, an n-type dopant such as Si, Ge, Sn, Se, and Te.

The active layer 51 may be formed of at least one of a single well, a single quantum well, a multi well, a multi quantum well (MQW) structure, a quantum-wire structure, or a quantum dot structure.

The active layer 51 is a layer in which electrons (or holes) injected through the first conductive semiconductor layer 41 and holes (or electrons) injected through the second conductive semiconductor layer 71 meet with each other and thus that emits light due to difference in a band gap of an energy band according to a forming material of the active layer 51.

The active layer 51 may be implemented by a compound semiconductor. The active layer 51 may be implemented by at least one of group II-VI and group III-V compound semiconductors, for example.

In a case where the active layer 51 is implemented by a multi-well structure, the active layer 51 includes a plurality of well layers (not illustrated) and a plurality of barrier layers (not illustrated). In the active layer 51, the well layer and the barrier layer are arranged alternately. The pair of the well layer and the barrier layer may be formed in 2 to 30 periods.

The well layer may be disposed as a semiconductor material having a composition formula of $In_xAl_yGa_{1-x-y}N$ (0≤X≤1, 0≤Y≤1, 0≤X+y≤1), for example. The barrier layer may be disposed as a semiconductor material having a composition formula of $In_xAl_yGa_{1-x-y}N$ (0≤X≤1, 0≤Y≤1, 0≤X+y≤1), for example.

The period of the well layer/barrier layer includes at least one of pairs of InGaN/GaN, GaN/ALGaN, ALGaN/ALGaN, InGaN/AlGaN, InGaN/InGaN, AlGaAs/GaAs, InGaAs/GaAs, InGaP/GaP, AlInGaP/InGaP, and Inp/GaAs, for example.

The well layer of the active layer 51 according to the embodiment may be implemented by AlGaN and the barrier layer may be implemented by AlGaN. The active layer 51 may emit light having ultraviolet wavelength and emit light having ultraviolet wavelength in the range of 200 nm to 290 nm, for example.

Composition of aluminum of the barrier layer has a higher composition than that of the well layer. Composition of aluminum of the well layer may be in a range from 20% to 40% and composition of aluminum of the barrier layer may be in a range from 40% to 95%. The barrier layer may include a dopant and may include an n-type dopant, for example.

The electron blocking layer 61 may be disposed on the active layer 51. The electron blocking layer 61 may be disposed as AlGaN semiconductor and may have higher composition of aluminum than the barrier layer of the active layer. The composition of aluminum of the electron blocking layer 61 may be 50% or more.

The electron blocking layer 61 may include a multilayer structure and may include plurality of semiconductor layers having compositions of aluminum, which are different from each other, for example, and at least one layer may have a composition of aluminum of 50% or more.

The second conductive semiconductor layer 71 is disposed on the electron blocking layer 61. The second conductive semiconductor layer 71 may include an AlGaN-based semiconductor. The second conductive semiconductor layer 71 may be a p-type semiconductor layer having a second conductivity type dopant, for example, a p-type dopant. As another example, the second conductive semiconductor layer 71 may include at least one of AlN, InAlGaN, AlInN, AlGaAs, or AlGaInP, and may include a p-type dopant such as Mg, Zn, Ca, Sr, and Ba. The second conductive semiconductor layer 71 may be disposed as an AlGaN-based semiconductor in order to prevent absorption of ultraviolet wavelength.

The second conductive semiconductor layer 71 may have a multilayer structure, but the present embodiment is not limited thereto.

In the embodiment, although it is described that the first conductivity type is n-type and the second conductivity type is p-type, as another example, the first conductivity type may be p-type and the second conductivity type may be n-type. Alternatively, the light emitting device may include any one structure of an n-p junction structure, a p-n junction structure, an n-p-n junction structure, and a p-n-p junction structure.

FIG. 3 illustrates an example in which electrodes are disposed in the light emitting device of FIG. 1. In description of FIG. 3, the same portions as configurations described above will be refer to the description of the embodiment disclosed above.

With reference to FIG. 3, the light emitting device 101 includes a first electrode 91 and a second electrode 95. The first electrode 91 is electrically connected to a first conductive type semiconductor layer, for example, any one layer of a plurality of superlattice layers 31, 33, 35, and 37 and the second electrode 95 can be electrically connected to a second conductive semiconductor layer 71.

The first electrode 91 may be disposed on at least one of the first conductive type semiconductor layer, for example, the plurality of superlattice layers 31, 33, 35, and 37 and the first conductive semiconductor layer 41 and the second electrode 95 may be disposed on the second conductive semiconductor layer 71.

The first electrode 91 and the second electrode 95 may further have a current diffusion pattern of an arm structure or a finger structure. The first electrode 91 and the second electrode 95 may be made of a metal having the characteristics of an ohmic contact, an adhesive layer, and a bonding layer, to be translucent. However, the present embodiment is not limited thereto. The first electrode 93 and the second electrode 95 may be formed of a material selected from Ti, Ru, Rh, Ir, Mg, Zn, Al, In, Ta, Pd, Co, Ni, Si, Ge, Ag, Au, and optional alloy thereof.

An electrode layer (not illustrated) may be disposed between the second electrode 95 and the second conductive semiconductor layer 71, the electrode layer may be formed of a translucent material that transmits light of 70% or more, or a material having reflective properties that reflects light of 70% or more, and may be formed of a metal or a metal oxide, for example. The electrode layer may be formed of material selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, NiO, Al, Ag, Pd, Rh, Pt and Ir. The electrode layer may be a laminate structure of a translucent layer/a reflective metal layer.

In addition, the substrate 21 may be provided with a thickness of 20 μm or less to decrease the absorption of ultraviolet wavelength. In addition, the substrate 21 may be separated from the light emitting device, but is not limited thereto. The light emitting device 101 according to the embodiment can emit light having ultraviolet wavelength, for example, a UVC wavelength.

FIG. 4 is a view illustrating an example of a vertical light emitting device using the light emitting device of FIG. 1. In description of FIG. 4, portions having the same configuration as those described above will refer to the description of the embodiments disclosed above.

With reference to FIG. 4, the light emitting device 102 includes a plurality of superlattice layers 31, 33, 35, and 37, a first electrode 91 which is disposed on at least one of the plurality of superlattice layers 31, 33, 35, and 37, for example a first superlattice layer 31, a first conductive semiconductor layer 41 and an active layer 51 which are disposed under the plurality of superlattice layers 31, 33, 35, and 37, and a second electrode which has a plurality of conductive layers 96, 97, 98, and 99 under a second conductive semiconductor layer 71.

The second electrode is disposed under the second conductive semiconductor layer 71 and includes a contact layer 96, a reflective layer 97, a bonding layer 98, and a support member 99. The contact layer 96 is in contact with the semiconductor layer, for example, the second conductive semiconductor layer 71. The contact layer 96 may be a low conductive material such as ITO, IZO, IZTO, IAZO, IGZO, IGTO, AZO, and ATO or may use a metal of Ni or Ag. A reflective layer 97 is disposed under the contact layer 96 and the reflective layer 97 is made of a structure including at least one layer which is formed of a material selected from a group including Ag, Ni, Al, Rh, Pd, Ir, Ru, Mg, Zn, Pt, Au, Hf, and the combination thereof. The reflective layer 97 may be contacted under the second conductive semiconductor layer 71, but the present embodiment is not limited thereto.

A bonding layer 98 is disposed under the reflective layer 97, the bonding layer 98 may be used as a barrier metal or a bonding metal, and the material thereof may include at least one of Ti, Au, Sn, Ni, Cr, Ga, In, Bi, Cu, Ag, and Ta and an optional alloy, for example.

A channel layer 83 and a current blocking layer 85 are disposed between the second conductive semiconductor layer 71 and the second electrode.

The channel layer 83 is formed along a lower surface edge of the second conductive semiconductor layer 71 and may be formed in a ring shape, a loop shape, or a frame shape. The channel layer 83 includes a transparent conductive material or an insulating material and may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The inner side portion of the channel layer 163 is disposed under the second conductive semiconductor layer 71 and the outer side portion thereof is disposed further outward than a side surface of the light emitting structure.

The current blocking layer 85 may be disposed between the second conductive semiconductor layer 71 and the contact layer 96 or the reflective layer 97. The current blocking layer 85 may include insulating material and may include at least one of $SiO_2$, $SiO_x$, $SiO_xN_y$, $Si_3N_4$, $Al_2O_3$, and $TiO_2$. As another example, the current blocking layer 85 may be also formed of a metal for Schottky contact.

The current blocking layer 85 is vertically disposed to correspond to the first electrode 91 in the vertical direction. The current blocking layer 85 may block the current supplied from the second electrode and diffuse the current to another path. One or a plurality of current blocking layer(s) 85 may be disposed and at least a portion or the entire region of the current blocking layer 85 may overlap the first electrode 91 in the vertical direction.

A support member 99 is formed under the bonding layer 98, the support member 99 may be formed of a conductive member, and the material thereof may be a conductive material such as copper (Cu), gold (Au), nickel (Ni), molybdenum (Mo), copper-tungsten (Cu—W), and carrier wafers (for example, Si, Ge, GaAs, ZnO, SiC, or the like). As another example, the support member 99 may be implemented as a conductive sheet.

Here, the substrate of FIG. 1 is removed. A growth substrate removal method may include by a physical method (for example, laser lift off) and/or a chemical method (wet etching, or the like) and can expose the first superlattice layer 31. The first electrode 91 is formed on the first superlattice layer 31 by performing the isolation etching in the direction in which the substrate is removed.

The upper surface of the first superlattice layer 31 may be formed with a light extraction structure (not illustrated) such as a roughness. Accordingly, The light emitting device 102 having a vertical electrode structure having the first electrode 91 over the light emitting structure and the support member 99 thereunder can be manufactured.

The light emitting device 102 according to the embodiment can emit light having ultraviolet wavelength, for example, a UVC wavelength.

<Light Emitting Device Package>

FIG. 5 is a view illustrating a light emitting device package having the light emitting device of FIG. 4.

With reference to FIG. 5, the light emitting device package includes a support member 110, a reflective member 111 that is disposed on the support member 110 and has a cavity 112, a light emitting device 101 according to an embodiment, which is disposed on the support member 110 and in the cavity 112, and a transparent window 115 which is disposed within the cavity 112.

The support member 110 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), liquid crystal polymer, PCB having a metal layer on the bottom (MCPCB: metal core PCB). However, the present embodiment is not limited to such a material.

The support member 110 includes a first metal layer 131, a second metal layer 133, a first connection member 138, a second connection member 139, a first electrode layer 135, and a second electrode layer 137. The first metal layer 131 and the second metal layer 132 are disposed to be spaced apart from each other on a bottom of the support member 110. The first electrode layer 135 and the second electrode layer 137 are disposed to be spaced apart from each other on an upper surface of the support member 110. The first connection member 138 may be disposed on an inner portion or a first side surface of the support member 110 and connects the first metal layer 131 and the first electrode layer 135 to each other. The second connection member 139 may be disposed on the inside portion or a second side surface of the support member 110 and connects the second metal layer 133 and the second electrode layer 137 to each other.

The first metal layer 131, the second metal layer 133, the first electrode layer 135 and the second electrode layer 137 may be formed of a metal material such as at least one of titanium (Ti), copper (Cu), nickel (Ni), gold (Au), chromium (Cr), tantalum (Ta), platinum (Pt), tin (Sn), silver (Ag) and phosphorus (P) or optional alloy thereof and may be formed of a single metal layer or a multilayer metal layer.

The first connection member 138 and the second connection member 139 include at least one of a via, a via hole, and a through hole.

The reflective member 111 may be disposed on the support member 110 around the cavity 112 to reflect ultraviolet light emitted from the light emitting device 101.

The reflection member 111 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), or a liquid crystal polymer. However, the present embodiment is not limited to such a material. The support member 110 and the reflecting member 111 may include a ceramic-based material and the ceramic-based material is characterized in that heat radiation efficiency thereof is higher than that of the resin material.

The light emitting device 101 may be disposed on the second electrode layer 137 or may be disposed on the support member 110 and may be electrically connected to the first electrode layer 135 and the second electrode layer 137. The light emitting device 101 may be connected by the wire 121. As another example, the light emitting device 101 may be bonded in a flip chip manner.

The light emitting device 101 may emit light having ultraviolet length or emit light having a different wavelength when the phosphor layer is disposed on the light emitting device 101.

The transparent window 115 is disposed within the cavity 112 and emits light having a peak wavelength emitted from the light emitting device 101. The transparent window 115 may include a glass material, a ceramic material, or a translucent resin material.

In addition, an optical lens or a phosphor layer may be further disposed within the cavity 112, but the present embodiment is not limited thereto.

The light emitting device or the light emitting device package according to the embodiment can be applied to a light unit. The light unit is an assembly having one or a plurality of light emitting device(s) or a light emitting device package, and may include an ultraviolet lamp.

FIG. 6 is a side sectional view illustrating a light emitting device according to the second embodiment. In description of the second embodiment, the same configuration as that of the first embodiment will refer to the description of the first embodiment.

With reference to FIG. 6, the light emitting device according to the embodiment includes a substrate 21, a plurality of superlattice layers 31, 33, 35, and 37 which are disposed on the substrate 21, a first conductive semiconductor layer 41 which is disposed on the plurality of superlattice layers 31, 33, 35, and 37, an active layer 51 which is disposed on the first conductive semiconductor layer 41, an electron blocking layer 61 which is disposed on the active layer 51, a second conductive semiconductor layer 71 which is disposed on the electron blocking layer 61, and a third conductive semiconductor layer 73 which is disposed on the second conductive semiconductor layer 71.

The light emitting device emits light having ultraviolet wavelength. The light emitting device may emit light having a wavelength of 290 nm or less, for example, a wavelength in a range of 200 nm to 290 nm. The light emitting device may be a device emitting light having UVC wavelength.

The plurality of superlattice layers 31, 33, 35, and 37 may be disposed between the substrate 21 and the first conductive semiconductor layer 41. The active layer 51 may be disposed on the first conductive semiconductor layer 41.

The plurality of superlattice layers 31, 33, 35, and 37 may include at least three superlattice layers, for example, at least four superlattice layers. Each of the plurality of superlattice layers 31, 33, 35, and 37 may include a plurality of pairs and one pair of the plurality of pairs includes at least two layers. In the plurality of superlattice layers 31, 33, 35, and 37, any one layer of each pair may be implemented by a group II-VI or a group III-V compound semiconductor and the other layer thereof may be implemented by a group II-VI or a group III-V compound semiconductor, as an example.

With reference to FIG. 2, each of the plurality of superlattice layers 31, 33, 35, and 37 may include a pair of first layers 11, 13, 15, and 17 and second layers 12, 14, 16, and 18 and the first layer 11, 13, 15, and 17 and the second layer 12, 14, 16, and 18 may include materials which are different from each other. In each of the superlattice layers 31, 33, 35, and 37, the first layers 11, 13, 15, and 17 and the second layers 12, 14, 16, and 18 may be disposed alternately.

Composition of aluminum of the first layers 11, 13, 15, and 17 of the superlattice layer can be gradually decreased, as the superlattice layer among the superlattice layers 31, 33, 35, and 37 is one which is positioned to be adjacent to the active layer 51. Difference in composition of aluminum of the first layer 11, 13, 15, and 17 and the second layer 12, 14, 16, and 18 of the superlattice layer can be gradually increased, as the superlattice layer among the superlattice layers 31, 33, 35, and 37 is one which is positioned to be adjacent to the active layer 51. Each of the superlattice layers 31, 33, 35, and 37 may have the same composition of aluminum in the second layers 12, 14, 16, and 18.

The thicknesses T1, T2, T3, and T4 of the first layer 11, 13, 15, and 17 of the superlattice layer can be gradually increased, as the superlattice layer among the superlattice layers 31, 33, 35, and 37 is one which is positioned to be adjacent to the active layer 51. The thicknesses of the plurality of superlattice layers 31, 33, 35, and 37 may be gradually increased, as the superlattice layer is positioned to be adjacent to the active layer 51.

The pair of the first layer 11, 13, 15, and 17/the second layer 12, 14, 16, and 18 of each of the superlattice layers 31, 33, 35, and 37 may include a pair of AlGaN/AlN. Composition of aluminum of AlGaN of the first layers 11, 13, 15, and 17 is gradually decreased, as the first layer is positioned to be adjacent to the active layer 51.

The difference in the composition of aluminum between the first layers 11, 13, 15, and 17 provided in the adjacent two superlattice layers among the plurality of superlattice layers 31, 33, 35, and 37 may be 10% or more. The difference in the composition of aluminum between the first layers 11, 13, 15, and 17 provided in the two superlattice layers positioned on the opposite sides to each other among the plurality of superlattice layers 31, 33, 35, and 37 may be 30% or more.

The plurality of superlattice layers 31, 33, 35, and 37 include, for example, first to fourth superlattice layers 31, 33, 35, and 37. The first superlattice layer 31 may be disposed between the substrate 21 and the second superlattice layer 33, the second superlattice layer 33 may be disposed between the first superlattice layer 31 and the third superlattice layer 35, the third superlattice layer 35 is disposed between the second superlattice layer 33 and the fourth superlattice layer 37, and the fourth superlattice layer 37 may be disposed between the third superlattice layer 35 and the first conductive semiconductor layer 41.

The first to fourth superlattice layers 31, 33, 35, and 37 will refer to the description of the first embodiment.

A first conductive semiconductor layer 41 may be disposed on the plurality of superlattice layers 31, 33, 35 and 37, an active layer 51 may be disposed on the first conductive semiconductor layer 41, an electron blocking layer 61 may be disposed on the active layer 51, a second conductive semiconductor layer 71 may be disposed on the electron blocking layer 61, and a third conductive semiconductor layer 73 may be disposed on the second conductive semiconductor layer 71.

The second and third conductive semiconductor layers 71 and 73 may be an AlGaN-based semiconductor, for example, AlGaN. The second conductive semiconductor layer 71 may have a composition of aluminum of 50% or more, and a p-type dopant may be added. The p-type dopant concentration may range from 1E16 cm-3 to 1E21 cm-3. If the p-type dopant concentration is less than the range described above, hole injection efficiency is decreased. If the p-type dopant concentration is more than the range described above, crystal quality can be decreased and the electrical characteristics of the third conductive semiconductor layer 73 can be affected.

In a case where the third conductive semiconductor layer 73 is GaN, light extraction efficiency can be decreased since the ultraviolet wavelength is absorbed. In a case where an oxide layer such as ITO is disposed on the third conductive semiconductor layer 73, the light extraction efficiency may be decreased due to the absorption of the ultraviolet wavelength. The embodiment can provide a layer which can be in ohmic contact with the second electrode 95 by composition of aluminum of the third conductive semiconductor layer 73. To this end, the third conductive semiconductor layer 73 may be an electrode contact layer that is in contact with the second electrode 95 or an ohmic contact layer and may be in ohmic contact with the second electrode 95.

Composition of the aluminum of the third conductive semiconductor layer 73 may be 40% or less, for example, in a range of 20% to 40%. In a case where composition of aluminum of the third conductive semiconductor layer 73 is deviated from the range described above, contact resistance between the second electrode 95 and the third conductive semiconductor layer 73 is increased. As illustrated in FIG. 11, in a case where composition of aluminum of the second conductive semiconductor layer 71 is in a range of 20% to 40%, the contact resistance thereof is lowered and may be $10^2$ $\Omega cm^2$ or less, and in a case where the aluminum of the second conductive semiconductor layer 71 deviates from the range described above, there is a problem that the contact resistance is increased by ten times or more.

In addition, the third conductive semiconductor layer 73 may be added by a second conductive type dopant such as a p-type dopant and the p-type dopant concentration may be in a range of 1 Ecm-18 or more, for example, a range of from 1 Ecm-18 to 1 Ecm-21. There is a problem that if concentration of the p-type dopant is less than the range described above, the contact resistance increases sharply and if the concentration of the p-type dopant is more than the range described above, film quality is decreased and thus ohmic characteristics are changed.

The third conductive semiconductor layer 73 may have a thickness of 50 nm or less, for example, 40 nm or less and the thickness is varied depending on the transmittance of ultraviolet wavelength according to the material and the thickness of the third conductive semiconductor layer 73.

The material of the second electrode 95 may be selected among metals that are in contact with the third conductive semiconductor layer 73 such as Ti, Ru, Rh, Ir, Mg, Zn, Al, In, Ta, Pd, Co, Ni, Si, Ge, Ag and Au, and optional alloys thereof. By providing the second and third conductive semiconductor layers 73 and 75 described above, the contact resistance between the second electrode 95 and the second and third conductive semiconductor layers 73 and 75 can be decreased, and the light transmittance can also be improved.

FIG. 7 is an example in which electrodes are disposed on the light emitting device of FIG. 6.

With reference to FIG. 7, the light emitting device includes the substrate 21, the plurality of superlattice layers 31, 33, 35 and 37, the first conductive semiconductor layer 41, the active layer 51, the electron blocking layer 61 according to the first embodiment, and the second and third conductive semiconductor layers 73 and 75 according to the second embodiment.

The light emitting device includes a first electrode 91 and a second electrode 95, and the first electrode 91 may be disposed under at least one of a plurality of super lattice layers 31, 33, 35, and 37 and a first conductive semiconductor layer 41 and the second electrode 95 may be disposed under the third conductive semiconductor layer 75.

A contact layer and a reflective layer are provided between the second electrode 95 and the third conductive semiconductor layer 75 and the contact layer include at least one of indium tin oxide (ITO), indium zinc oxide (IZO), indium zinc tin Oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, NiO, Al, Ag, Pd, Rh, Pt, Ir or a plurality of compound materials and the reflective layer may include at least one of Al, Ag, Pd, Rh, Pt, and Ir.

The substrate 21 may have a thickness of 20 µm or less in order to minimize light absorption and improve light transmittance. In addition, a light extracting structure 21A such as a roughness may be provided on the upper surface of the substrate 21.

The substrate 21 may be a bulk AlN substrate or a sapphire substrate for the growth of AlGaN, which is the first layer 11, 13, 15, and 17 of the first superlattice layer 31.

The light emitting device 103 is disposed in a flip structure and can extract light in the substrate direction. For example, the light emitting device of FIG. 7 can be mounted as a flip chip structure as illustrated in FIG. 8.

FIG. 9 is a view illustrating a light source module having a light emitting device or a light emitting device package according to the embodiment. The light source module according to the embodiment may be a light unit.

With reference to FIG. 9, the light source module according to the embodiment includes a light emitting device package 201 that has the light emitting device 103 disclosed in the embodiment, a circuit board 301 on which the light emitting device package 201 is disposed, and a moisture-proof film 275 that covers the light emitting device package 201 and the circuit board 301.

The light emitting device package 201 includes a body 210 which has a cavity 211, a plurality of electrodes 221 and 225 which are disposed in the cavity 211, a light emitting device 103 which is disposed on at least one of the plurality of electrodes 221 and 225, and a transparent window 261 which is disposed within the cavity 111.

The light emitting device 103 may include an optional peak wavelength within a range of ultraviolet wavelength to visible wavelength. The light emitting device 103 may emit light having, for example, a UVC wavelength, that is ultraviolet wavelength in the range of 200 nm to 290 nm.

The body 210 includes an insulating material such as a ceramic material. The ceramic material includes a low temperature co-fired ceramic (LTCC) or a high temperature co-fired ceramic (HTCC) which is co-fired. The material of the body 210 may be, for example, MN and may be formed of a metal nitride having a thermal conductivity of 140 W/mK or more.

The upper periphery of the body 210 includes a stepped structure 215. The stepped structure 215 is a region that is lower than the upper surface of the body 210 and is disposed on the upper periphery of the cavity 211. The depth of the stepped structure 215 is a depth from the upper surface of the body 210 and may be formed to be deeper than the thickness of the transparent window 261, but is not limited thereto.

The cavity 211 is a region where a portion of the upper region of the body 210 is opened and may be formed to have a predetermined depth from the upper surface of the body 210.

The cavities 211 and the electrodes 221 and 225 in the body 210 may be electrically connected to the electrode pads 241 and 245 disposed on the lower surface of the body 210. Material of the electrodes 221 and 225 and the electrode pads 241 and 245 may selectively include a metal such as platinum (Pt), titanium (Ti), copper (Cu), nickel (Ni), gold (Au), tantalum (Ta), and aluminum (Al).

The light emitting device 103 may be mounted on the electrodes 221 and 225 in the cavity 211 in a flip chip manner without a separate wire. The light emitting device 103 may be an ultraviolet light emitting diode according to the first and second embodiments, and may be an ultraviolet light emitting device having a wavelength ranging from 200 nm to 290 nm.

The transparent window 261 is disposed within the cavity 211. The transparent window 261 includes a glass material such as quartz glass. Accordingly, the transparent window 261 can be defined as a material that can be transmitted the light emitted from the light emitting device 103 without damages such as bond breakage between molecules due to the ultraviolet wavelength.

The outer periphery of the transparent window 261 is coupled to the stepped structure 215 of the body 210. An adhesive layer 263 is applied between the transparent window 261 and the stepped structure 215 of the body 210 and the adhesive layer 263 includes a resin material such as silicone or epoxy.

The transparent window 261 may be spaced apart from the light emitting device 103. Expansion of the transparent window 261 due to the heat generated by the light emitting device 103 can be prevented by the transparent window 261 being spaced apart from the light emitting device 103.

The circuit board 301 includes a plurality of bonding pads 304 and 305 and the plurality of bonding pads 304 and 305 may be electrically connected to the pads 241 and 245 disposed on the lower surface of the body 210.

The circuit board 301 may be connected to the signal cables 311 and 313 through external connection terminals 307 and 308 and the signal cables 311 and 313 supply power from the outside.

The moisture-proof film 275 is disposed on the upper surface and the side surface of the light emitting device package 201 and on the upper surface of the circuit board 301. The moisture-proof film 275 is disposed on the upper surface of the transparent window 261 and the upper surface and the side surface of the body 210 of the light emitting device package 201. An extended portion 271 of the moisture-proof film 275 extends from the side surface of the body 210 to the upper surface of the circuit board 301 and is disposed thereon.

The moisture-proof film 275 is a fluororesin-based material and can transmit the light without being broken by the light emitted from the light-emitting element 103. The moisture-proof film 275 may use at least one of polychlorotrifluoroethylene (PCTFE), ethylene+tetrafluoroethylene (ETFE), fluorinated ethylene propylene copolymer (FEP), and perfluoroalkoxy (PFA).

The moisture-proof film 275 may block water or moisture penetrating into the circuit board 301 as well as water or moisture penetrating through the side surface and the upper surface of the light emitting device package 201. The thickness of the moisture-proof film 275 may be formed in the range of 0.5 μm to 10 μm and when the thickness of the moisture-proof film 275 exceeds the above range, the light transmittance is markedly decreased, and when the thickness of the moisture-proof film 275 is less than the range described above, the humidity resistance is decreased.

The moisture-proof film 275 may be spaced apart from the bonding areas of the external connection terminals 307 and 308 and the signal cables 311 and 313. As another example, the moisture-proof film 275 may cover the external connection terminals 307 and 308. In this case, the moisture-proof film 275 can prevent penetration of water or moisture through the external connection terminals 307 and 308.

As illustrated above, the features, structures, effects and the like described in the embodiments are included in at least one embodiment and are not necessarily limited to only one embodiment. Further, the features, structures, effects, and the like illustrated in each embodiment can be implemented by being combined and modified with respect to the other embodiment by those of ordinary skill in the art to which the invention pertains. Accordingly, it is to be understood that the contents relating these combinations and modifications include within the scope of the present invention.

In addition, as illustrated described above, although the embodiments are mainly described, the embodiments are merely described as examples and do not limit the present invention and it will be understood that those of ordinary skill in the art to which the invention pertains can performs various modifications and applications which are not described as examples in the description described above without departing from essential characteristics of the present embodiment. For example, each component specifically illustrated in the embodiment can be modified and implemented. It is to be understood that the differences related the modifications and applications are contained in the scope of the present invention defined in claims attached.

INDUSTRIAL APPLICABILITY

The light emitting device according to the embodiments can provide a device for Ultraviolet-C (UV-C) wavelength.

The embodiments can improve the transmittance of the ultraviolet light emitting device.

The embodiments can improve the electrical characteristics of the ultraviolet light emitting device.

The invention claimed is:
1. A light emitting device comprising:
a plurality of superlattice layers;
a first conductive semiconductor layer on the plurality of superlattice layers;
an active layer that is disposed on the first conductive semiconductor layer and has a plurality of barrier layers and a plurality of well layers; and
a second conductive semiconductor layer which is disposed on the active layer,
wherein the plurality of superlattice layers include at least three superlattice layers,
wherein each of the at least three superlattice layers has a plurality of pairs of at least a first layer and a second layer,
wherein a composition of aluminum in the first layer of a superlattice layer becomes smaller, as the superlattice layer among the at least three superlattice layers becomes one which is positioned to be adjacent to the active layer,
wherein each of the at least three superlattice layers has the same composition of aluminum in the second layer,
wherein the second layer is disposed on the first layer in each of the superlattice layers,
wherein the first conductive semiconductor layer contacts the second layer of the superlattice layer which is positioned to be adjacent to the active layer, and
wherein the plurality of superlattice layers include a first superlattice layer, a second superlattice layer on the first superlattice layer, a third superlattice layer on the second superlattice layer, and a fourth superlattice layer between the third superlattice layer and the first conductive semiconductor layer.

2. The light emitting device according to claim 1, wherein the first conductive semiconductor layer and the plurality of superlattice layers include an n-type dopant, and
wherein the second conductive semiconductor layer includes a p-type dopant.

3. The light emitting device according to claim 1, wherein the pair of the first layer/the second layer of each of the first to fourth superlattice layers includes a pair of AlGaN/AlN.

4. The light emitting device according to claim 3, wherein composition of aluminum in the first layer of a superlattice layer is gradually decreased, as the first layer of the superlattice layer among the plurality of superlattice layers is one which is positioned to be adjacent to the first conductive semiconductor layer,
wherein the first conductive semiconductor layer includes an n-type semiconductor layer, and
wherein the first conductive semiconductor layer contacts the second layer formed of AlN material.

5. The light emitting device according to claim 3, wherein composition of aluminum of the first layer of a superlattice layer is gradually increased, as the first layer of the superlattice layer among the plurality of superlattice layers is one which is positioned to be farther away from the first conductive semiconductor layer,
wherein the first conductive semiconductor layer includes an n-type semiconductor layer, and
wherein the first conductive semiconductor ayer contacts the second layer formed of AlN material.

6. The light emitting device according to claim 3, wherein difference in composition of aluminum between the first layers provided in the first and second superlattice layers which are positioned to be adjacent among the plurality of superlattice layers is 10% or more.

7. The light emitting device according to claim 3, wherein difference in composition of aluminum between the first layers provided in the first and fourth superlattice layers among the plurality of superlattice layers is 30% or more.

8. The light emitting device according to claim 2, wherein difference in composition of aluminum of the second layers of superlattice layers adjacent to the first conductive semiconductor layer and the active layer has a difference of 45% or more,
wherein the first conductive semiconductor layer is formed of AlGaN, and
wherein the second layer is formed of AlN.

9. The light emitting device according to claim 2, wherein a thickness of the first conductive semiconductor layer has a difference of 40 times or more of a thickness of the first layer which is positioned to be adjacent to the first conductive semiconductor layer.

10. The light emitting device according to claim 1, further comprising:
an AlN substrate which is disposed under the plurality of superlattice layers; and
a current blocking layer disposed between the active layer and the second conductive semiconductor layer.

11. The light emitting device according to claim 8, further comprising:
a third conductive semiconductor layer on the second conductive semiconductor layer and an electrode which is in contact with the third conductive semiconductor layer,
wherein the third conductive semiconductor layer includes a p-type semiconductor layer having composition of aluminum which is less than that of the second conductive semiconductor layer.

12. The light emitting device according to claim 11, wherein composition of aluminum of the third conductive semiconductor layer is in a range of 20% to 40% and is in ohmic contact with the electrode.

13. The light emitting device according to claim 3, wherein the each pair of the plurality of superlattice layers has 10 to 15 pairs.

14. The light emitting device according to claim 13, wherein a thickness of the first layer of the first superlattice layer is less than a thickness of the first layers of the second to the fourth superlattice layers and is in a range of 5 nm to 20 nm,
wherein a thickness of the second layer in the first superlattice layer is in a range of 5 mm to 20 mm, and
wherein a thickness of the first conductive semiconductor layer has a difference of 40 times or more of a thickness of the first layer of the fourth superlattice layer.

15. A light emitting device comprising:
a plurality of superlattice layers;
a first conductive semiconductor layer on the plurality of superlattice layers;
an active layer that is disposed on the first conductive semiconductor layer and has a plurality of barrier layers and a plurality of well layers; and
a second conductive semiconductor layer which is disposed on the active layer,
wherein the plurality of superlattice layers include at least three superlattice layers,
wherein each of the at least three superlattice layers has a plurality of pairs of at least a first layer and a second layer,
wherein difference in composition of an aluminum between the first layer and the second layer of a superlattice layer adjacent to the active layer becomes greater than difference in composition of an aluminum between the first layer and the second layer of another superlattice layer in the superlattice layers,
wherein a thickness of the first layer of the superlattice layer adjacent to the active layer is greater than a thickness of the first layer of another superlattice layer in the superlattice layers,
wherein the second layer is disposed on the first layer in each of the superlattice layers,
wherein the first layer of each of the at least three superlattice layers have a different thickness from each other,
wherein the plurality of superlattice layers include a first superlattice layer, a second superlattice layer on the first superlattice layer, a third superlattice layer on the second superlattice layer, and a fourth superlattice layer between the third superlattice layer and the first conductive semiconductor layer, and
wherein the pair of the first layer/the second layer of each of the first to fourth superlattice layers includes a pair of AlGaN/AlN.

16. The light emitting device according to claim 15, wherein the first layers of superlattice layers adjacent to the first conductive semiconductor layer and the active layer have the same composition of aluminum, and
wherein the first conductive semiconductor layer is formed of AlGaN.

17. The light emitting device according to claim 15, wherein the active layer emits light of UV-C wavelength.

18. The light emitting device according to claim 15, further comprising AlN substrate disposed under the plurality of superlattice layers, wherein the first conductive semiconductor layer and the plurality of superlattice layers include an n-type dopant, wherein the second conductive semiconductor layer includes a p-type dopant, and wherein the first conductive semiconductor layer contacts the second layer formed of AlN material.

19. The light emitting device according to claim 15, wherein the each pair of the plurality of superlattice layers has 10 to 15 pairs, wherein a thickness of the first layer of the first superlattice layer is less than a thickness of the first layers of the second to the fourth superlattice layers and is in a range of 5 nm to 20 nm, wherein a thickness of the second layer in the first superlattice layer is in a range of 5 mm to 20 mm, wherein a thickness of the first conductive semiconductor layer has a difference of 40 times or more of a thickness of the first layer of the fourth superlattice layer, wherein the first layers of superlattice layers adjacent to the first conductive semiconductor layer and the active layer have the same composition of aluminum, wherein the first conductive semiconductor layer is formed of AlGaN, and wherein the active layer emits light of UV-C wavelength.

20. A lighting unit comprising:

a body which has a cavity;

a light emitting device disposed in the cavity, the light emitting device comprising:

a plurality of superlattice layers;

a first conductive semiconductor layer on the plurality of superlattice layers;

an active layer that is disposed on the first conductive semiconductor layer and has a plurality of barrier layers and a plurality of well layers; and a second conductive semiconductor layer which is disposed on the active layer, wherein the plurality of superlattice layers include at least three superlattice layers, wherein each of the at least three superlattice layers has a plurality of pairs of at least a first layer and a second layer, wherein a composition of aluminum in the first layer of a superlattice layer becomes smaller, as the superlattice layer among the at least three superlattice layers becomes one which is positioned to be adjacent to the active layer, wherein each of the at least three superlattice layers has the same composition of aluminum in the second layer, wherein the second layer is disposed on the first layer in each of the superlattice layers, wherein the first conductive semiconductor layer contacts the second layer of the superlattice layer which is positioned to be adjacent to the active layer, and wherein the plurality of superlattice layers include a first superlattice layer, a second superlattice layer on the first superlattice layer, a third superlattice layer on the second superlattice layer, and a fourth superlattice layer between the third superlattice layer and the first conductive semiconductor layer;

a transparent window which is disposed within the cavity; and a moisture-proof film which is disposed on the transparent window and the body.

* * * * *